(12) United States Patent
Liu

(10) Patent No.: US 10,547,374 B1
(45) Date of Patent: Jan. 28, 2020

(54) RANDOM ACCESS FOR LTE OVER SATELLITE

(71) Applicant: LOCKHEED MARTIN CORPORATION, Bethesda, MD (US)

(72) Inventor: Xiangdong Liu, Boyds, MD (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/846,125

(22) Filed: Dec. 18, 2017

Related U.S. Application Data

(60) Provisional application No. 62/458,539, filed on Feb. 13, 2017.

(51) Int. Cl.
| | |
|---|---|
| *H04B 7/185* | (2006.01) |
| *H04W 74/08* | (2009.01) |
| *H04B 7/06* | (2006.01) |
| *H04L 5/00* | (2006.01) |
| *H04W 56/00* | (2009.01) |

(Continued)

(52) U.S. Cl.
CPC ......... *H04B 7/18513* (2013.01); *G01R 29/26* (2013.01); *H04B 7/0617* (2013.01); *H04B 17/364* (2015.01); *H04L 5/0098* (2013.01); *H04W 56/0045* (2013.01); *H04W 74/0833* (2013.01); *H04B 7/2041* (2013.01)

(58) Field of Classification Search
CPC .............. G01R 31/31708; G01R 29/26; G01R 31/31715; G01R 31/31932; G01R 13/0218; G01R 27/2623; G01R 31/3177
USPC .......................................... 375/286; 330/134
See application file for complete search history.

(56) References Cited

U.S. PATENT DOCUMENTS

| | | |
|---|---|---|
| 6,570,859 B1 | 5/2003 | Cable |
| 9,402,176 B2 | 7/2016 | Wang |

(Continued)

FOREIGN PATENT DOCUMENTS

| | | |
|---|---|---|
| EP | 2793530 | 10/2014 |
| KR | 2013-0125280 | 11/2013 |

(Continued)

OTHER PUBLICATIONS

3GPP, Non-Access Startum (NAS) Protocol for Evolved Packet Systems (EPS); Stage 3 (Release 14, Dec. 2016, 3Gpp, Version 14.2.0, 470 pages.

*Primary Examiner* — David C Payne
*Assistant Examiner* — Sarah Hassan
(74) *Attorney, Agent, or Firm* — Morgan, Lewis & Bockius LLP

(57) ABSTRACT

A method for of communication in a satellite LTE network by a satellite base station includes transmitting to a terminal device in a satellite beam of the satellite base station a frame having embedded timing information. The timing information includes a lowest delay time associated with the satellite beam. An uplink acquisition message is received from the terminal device. The uplink acquisition message is received with a first timing advance (TA) value estimated by the terminal device based on the lowest delay time. An arrival time associated with the uplink acquisition message is estimated, and a second TA value is determined based on the estimated arrival time. The terminal device uses the sum of first TA and second TA to adjust its timing in subsequent transmissions.

17 Claims, 12 Drawing Sheets

(51) Int. Cl.
*H04B 17/364* (2015.01)
*G01R 29/26* (2006.01)
*H04B 7/204* (2006.01)

(56) References Cited

U.S. PATENT DOCUMENTS

| | | |
|---|---|---|
| 9,930,613 B2 | 3/2018 | Starsinic |
| 2002/0041328 A1 | 4/2002 | LeCompte |
| 2004/0185775 A1 | 9/2004 | Bell |
| 2008/0159419 A1* | 7/2008 | Smith .............. H04B 7/18534 375/260 |
| 2010/0068993 A1 | 3/2010 | Khan |
| 2010/0280907 A1 | 11/2010 | Wolinsky et al. |
| 2012/0058791 A1 | 3/2012 | Bhattad |
| 2012/0063302 A1* | 3/2012 | Damnjanovic ... H04W 56/0045 370/228 |
| 2012/0154055 A1 | 6/2012 | Yamamoto |
| 2013/0195002 A1* | 8/2013 | Walker ................. H04W 4/00 370/312 |
| 2013/0336256 A1 | 12/2013 | Chung |
| 2014/0226502 A1 | 8/2014 | Behnamfar |
| 2014/0293937 A1 | 10/2014 | Lee |
| 2015/0071169 A1 | 3/2015 | Wang |
| 2015/0319567 A1 | 11/2015 | Edge |
| 2015/0327328 A1 | 11/2015 | Novak et al. |
| 2016/0192277 A1 | 6/2016 | Sarsinic |
| 2016/0219569 A1 | 7/2016 | Kuo |
| 2016/0241325 A1 | 8/2016 | Raghothaman |
| 2016/0366687 A1 | 12/2016 | Guo |
| 2017/0019882 A1 | 1/2017 | Nimbalker et al. |
| 2017/0019914 A1 | 1/2017 | Rune |
| 2017/0041830 A1 | 2/2017 | Davis |
| 2017/0094512 A1 | 3/2017 | Kiss |
| 2017/0195930 A1 | 7/2017 | Tomici |
| 2017/0332416 A1 | 11/2017 | Kiss |
| 2018/0092157 A1 | 3/2018 | Chen |
| 2018/0146445 A1 | 5/2018 | Lee |
| 2018/0227752 A1 | 8/2018 | Teyeb |
| 2018/0270703 A1 | 9/2018 | Kodali |
| 2018/0295651 A1 | 10/2018 | Cao |
| 2018/0352547 A1 | 12/2018 | Tabet |
| 2018/0376384 A1 | 12/2018 | Youn |
| 2019/0052603 A1 | 2/2019 | Wu |
| 2019/0124561 A1 | 4/2019 | Faccin |

FOREIGN PATENT DOCUMENTS

| | | |
|---|---|---|
| KR | 2013-0125281 | 11/2013 |
| KR | 2016-0053562 | 5/2016 |
| WO | WO 2013/086917 | 6/2013 |
| WO | WO 2013/168872 | 11/2013 |
| WO | WO 2013/168880 | 11/2013 |
| WO | WO 2017/045123 | 3/2017 |

* cited by examiner

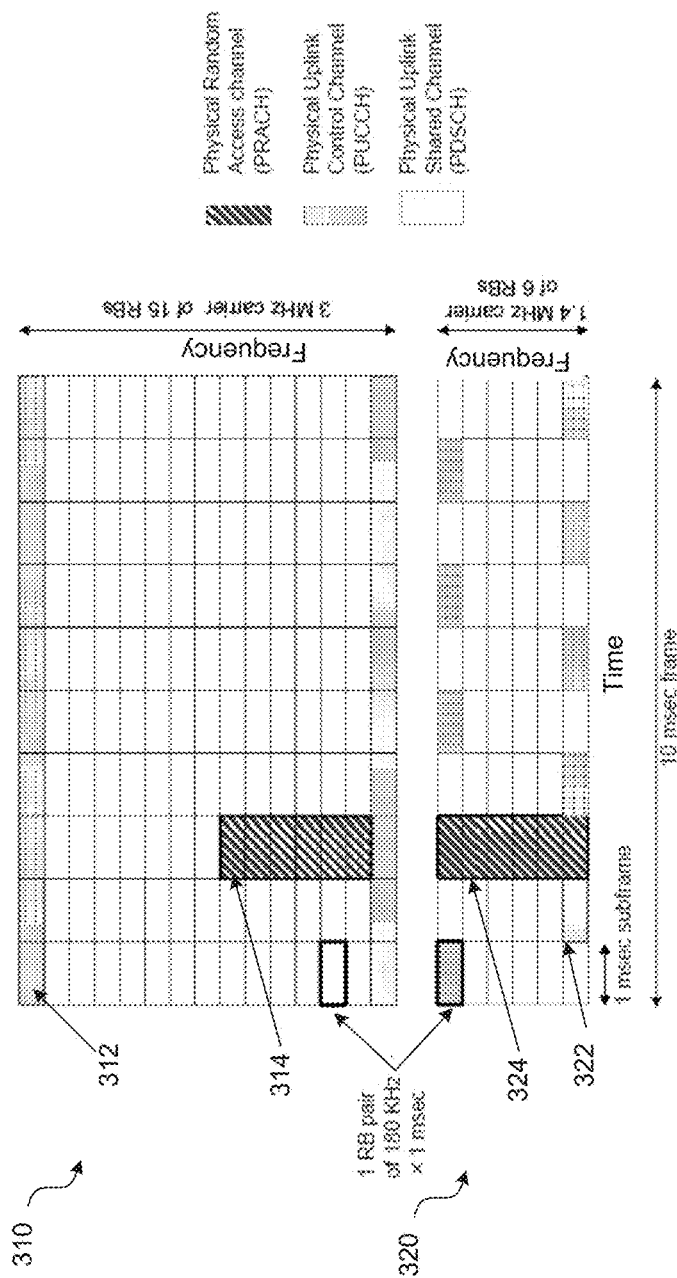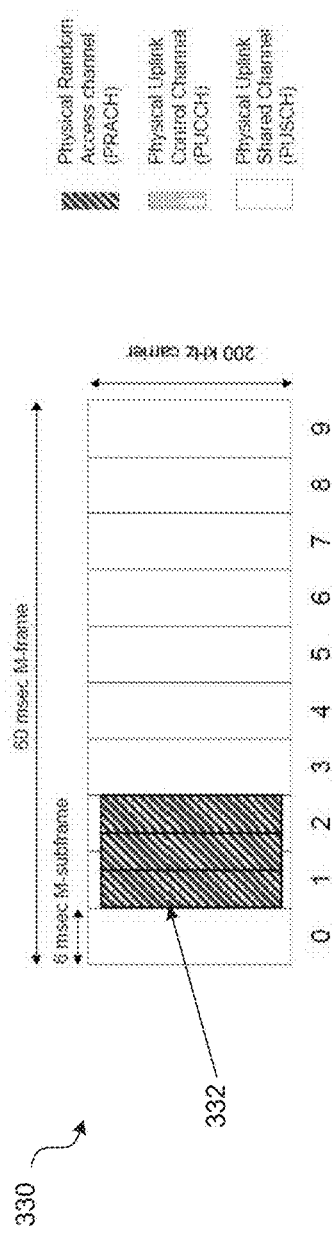
FIG. 3A
FIG. 3B

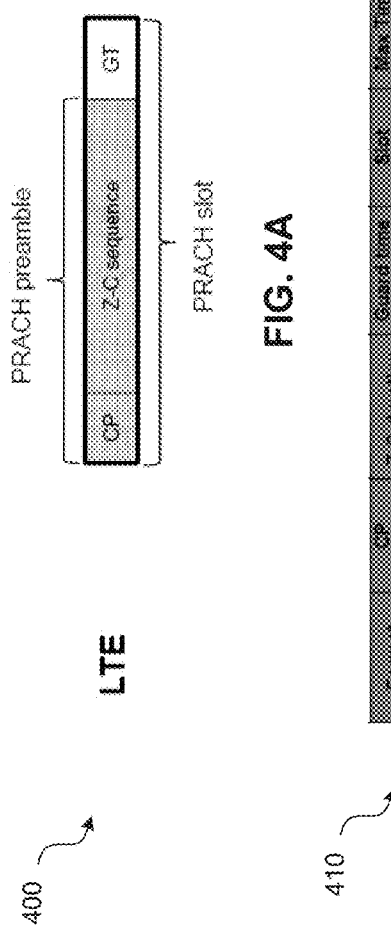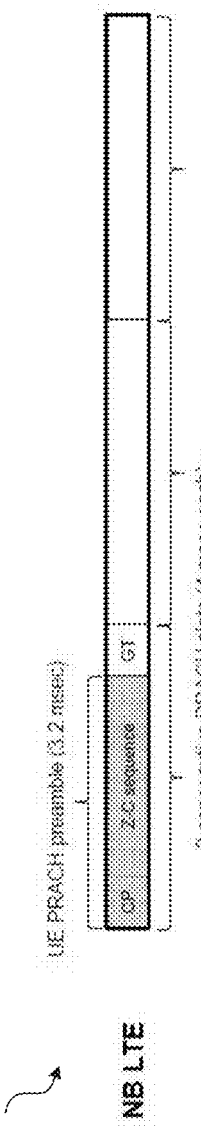
FIG. 4A
FIG. 4B
FIG. 4C
FIG. 4D

| Format | CP duration | Z-C sequence duration | Guard time duration | Slot duration | Max Timing Uncertainty | Max Differential Delay |
|---|---|---|---|---|---|---|
| 0 | 0.103 | 0.800 | 2.097 | 3 | 2.097 | 1.049 |
| 0.4 | 0.103 | 0.800 | 3.097 | 4 | 3.097 | 1.549 |
| 0.5 | 0.103 | 0.800 | 4.097 | 5 | 4.097 | 2.049 |
| 0.9 | 0.103 | 0.800 | 8.097 | 9 | 8.097 | 4.049 |
| 1 | 0.684 | 0.800 | 1.516 | 3 | 1.516 | 0.758 |
| 1.4 | 0.684 | 0.800 | 2.516 | 4 | 2.516 | 1.258 |
| 1.5 | 0.684 | 0.800 | 3.516 | 5 | 3.516 | 1.758 |
| 1.10 | 0.684 | 0.800 | 8.516 | 10 | 8.516 | 4.258 |
| 2 | 0.203 | 1.600 | 2.197 | 4 | 2.197 | 1.099 |
| 2.5 | 0.203 | 1.600 | 3.197 | 5 | 3.197 | 1.599 |
| 2.6 | 0.203 | 1.600 | 4.197 | 6 | 4.197 | 2.099 |
| 2.10 | 0.203 | 1.600 | 8.197 | 10 | 8.197 | 4.099 |
| 3 | 0.684 | 1.600 | 1.716 | 4 | 1.716 | 0.858 |
| 3.5 | 0.684 | 1.600 | 2.716 | 5 | 2.716 | 1.358 |
| 3.6 | 0.684 | 1.600 | 3.716 | 6 | 3.716 | 1.858 |
| 3.10 | 0.684 | 1.600 | 7.716 | 10 | 7.716 | 3.858 |

US 10,547,374 B1

RANDOM ACCESS FOR LTE OVER SATELLITE

CROSS-REFERENCE TO RELATED APPLICATIONS

This application claims the benefit of priority under 35 U.S.C. § 119 from U.S. Provisional Patent Application 62/458,539 filed Feb. 13, 2017, which is incorporated herein by reference in its entirety.

STATEMENT REGARDING FEDERALLY SPONSORED RESEARCH OR DEVELOPMENT

Not applicable

FIELD OF THE INVENTION

The present invention generally relates to satellite communications, and more particularly, to random access for long-term evolution (LTE) over satellite.

BACKGROUND

There is significant interest in using the 4G long term evolution (LTE) physical layer over satellite links. Mobile satellite networks are increasingly assessing the use of LTE as the air interface (radio access technology) for next generation systems. Using the widely deployed, field proven LTE physical layer in conjunction with associated Layer 2 and 3 radio access technologies can be very beneficial for satellite networks. LTE technology provides several benefits, for example, seamless support for 4G and/or evolved packet system (EPS)-based services, a range of standardized modulation and coding schemes and standardized resource definitions (e.g., frequency and time) that are well suited for 4G and/or EPS services. LTE technology further supports dynamic control of modulation/coding depending upon link and terminal characteristics, supports dynamic resource allocation depending upon user traffic needs and is compatible with the evolved packet core (EPC) network via the S1 interface. There are, however, a number of areas where LTE default protocols and/or procedures need to be modified for use in a satellite environment.

SUMMARY

According to various aspects of the subject technology, methods and configuration are provided for adaptation of the LTE over satellite system and to resolve issues related to highest differential delay within a large beam size (e.g., with a diameter larger than about 0.2 degrees).

In one or more other aspects, a method of communication in a satellite LTE network by a satellite base station includes transmitting to a terminal device in a satellite beam of the satellite base station a frame having embedded timing and frequency information. The timing information includes a lowest delay time associated with the satellite beam. An uplink response is received from the terminal device. The uplink response is received with a first timing advance (TA) value estimated by the terminal device based on the lowest delay time. An arrival time associated with the uplink response is estimated, and a second TA value is determined based on the estimated arrival time.

In one or more other aspects, a method for communication in a satellite LTE network includes receiving by a terminal device from a satellite base station a frame having embedded timing and frequency information. The timing information includes a lowest delay time associated with a satellite beam. A first timing advance (TA) value is estimated based on the lowest delay time. An uplink response is transmitted to the satellite base station. The uplink response is advanced in time by the first TA value.

In yet one or more other aspects, a method for communication over a satellite LTE network includes receiving by a terminal device from a satellite base station a plurality of consecutive frames. Each frame has embedded timing and frequency information including a scrambled master information block (MIB). The scrambled MIB of each received frame is decoded to recover a respective system frame number (SFN). A first global positioning system (GPS) time of arrival of a received frame having as SFN approximately equal to a predetermined value is measured. A second GPS time associated with a transmission time of the received frame from the satellite base station is derived from the first GPS time and the predetermined value.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein:

FIGS. 3A-3B are diagrams illustrating examples of an LTE uplink (UL) and a narrow-band (NB) LTE UL frequency-time resource grid.

FIGS. 4A through 4D are diagrams illustrating an example of an LTE acquisition preamble, an NB LTE acquisition preamble and corresponding parameter tables.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The present disclosure is directed, in part, to methods and configurations for random access for long-term evolution (LTE) over a satellite network. The disclosed technology, further provides solutions for adaptation of the LTE over satellite system and to resolve issues related to acquisition with high differential delay within a beam size (e.g., with a diameter larger than about 0.2 degrees), as described in detail herein.

Figure 1:
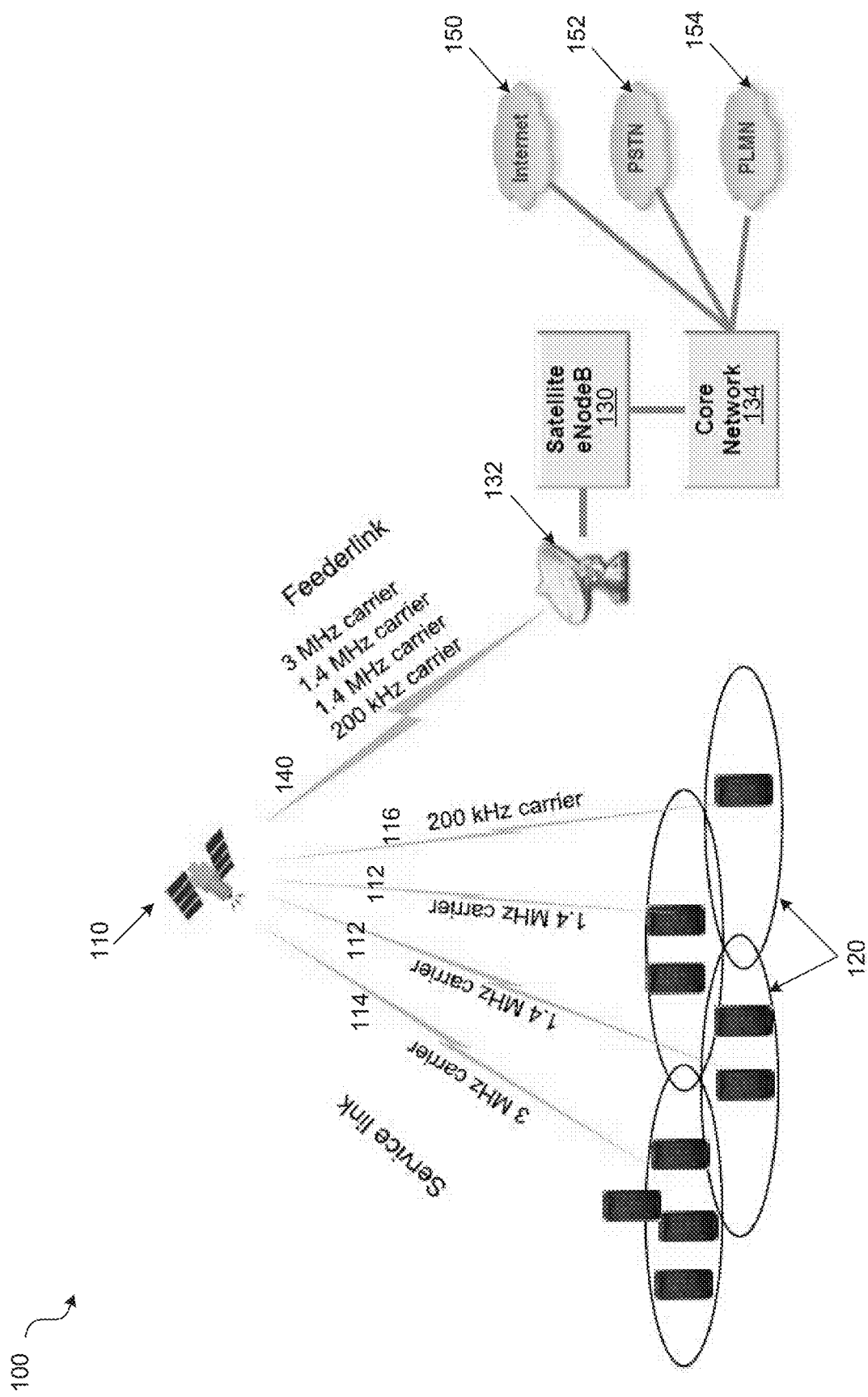
FIG. 1 is a high-level diagram illustrating an example environment for deployment of a satellite system with LTE technology, according to certain aspects of the disclosure.

FIG. 1 is a high-level diagram illustrating an example environment 100 for deployment of a satellite system with LTE technology, according to certain aspects of the disclosure. The environment 100 includes a space vehicle (e.g., a satellite) 110, a terminal devices 120, a multi-cell satellite base station (e.g., eNodeB or eNB) 130, the satellite base station antenna (e.g., a reflector antenna, such as a dish antenna) 132, and a core network 134. The core network 134 is communicatively coupled to a number of networks such as the Internet 150, the public switched telephone network (PSTN) 152 and the public land mobile network (PLMN) 154. The terminal devices 120, also referred to as terminals or UEs, are coupled to the satellite 110 via a number of LTE communication channels such as channels 112 (e.g., 1.4 MHz carrier channel), 114 (e.g., 3 MHz carrier channel), and 116 (e.g., 200 KHz). The satellite eNB 130 is coupled to the base station satellite antenna 132 that communicates with the satellite 110 via a feederlink 140. The satellite eNB 130 can transmit at least one downlink OFDMA carrier paired with an uplink SC-FDMA carrier in each satellite beam (cell). In each beam (cell), there may be zero, one, or more user terminals or user devices 120. On the service link (to end-users), radio carriers may be in, for example, L-band (e.g., about 1-2 GHz) or S-band (e.g., about 2-4 GHz), and on the feederlink side, carriers may be in, for example, C-band (e.g., about 4-8 GHz) or Ku-band (e.g., about 12-18 GHz). For instance, the feederlink 140 may support a number of carriers, for example, two 1.4 MHz, one 3 MHz, and one 200 KHz carriers.

To support machine-to-machine (M2M) internet of things (IoT) with user devices that are low power and low duty cycle (e.g., long idle time between transmitting and receiving short data messages), 3GPP has started to standardize an extension to LTE, called narrowband LTE (NB LTE) that operates on 200 kHz carriers but reuse most of the LTE technologies. Adapting NB LTE to satellite links provides M2M IoT over a large geographic area, with the same benefits stated above for LTE over satellite. More importantly, NB LTE over satellite may provide service to normal users in beams with low traffic volume to conserve service link and feederlink spectrum and also to allow use of small profile and/or low power terminals. Therefore, the environment 100 is in fact a hybrid LTE and/or NB LTE over Satellite system. It is advantageous to reuse as much as possible the terrestrial LTE and NB LTE design in LTE and NB LTE over satellite, and to make modifications only when necessary to fit to the satellite environment. Doing so allows maximal reuse of terrestrial LTE equipment and product components and minimizes system development and deployment cost.

As in terrestrial LTE, a terminal 120 must be time synchronized with the satellite eNB 130 in the return (terminal-to-satellite eNB) direction, to be able to transmit information to the satellite eNB 130. For time synchronization, the terminal 120 first obtains and then maintains information of the precise time delay between itself and the satellite eNB 130. With the precise time delay information, the terminal 120 can subsequently determine the precise instance of time to start transmitting a burst to the satellite eNB 130 such that the burst arrives at the satellite eNB 130 at a time that the satellite eNB 130 expects the burst from the particular terminal, and the burst does not overlap with bursts from other terminals that use the same frequency.

In some aspects, the subject technology provides two acquisition methods applicable to the system of environment 100. The acquisition methods allow a user terminal (e.g., 120) to obtain its delay to the satellite eNB (e.g., 130), while preserving the LTE and the NB LTE channelization and time frame structures, and making a few changes to the processing at the satellite eNB 130 and at the terminal 120, as discussed in more details herein.

Figure 2A:
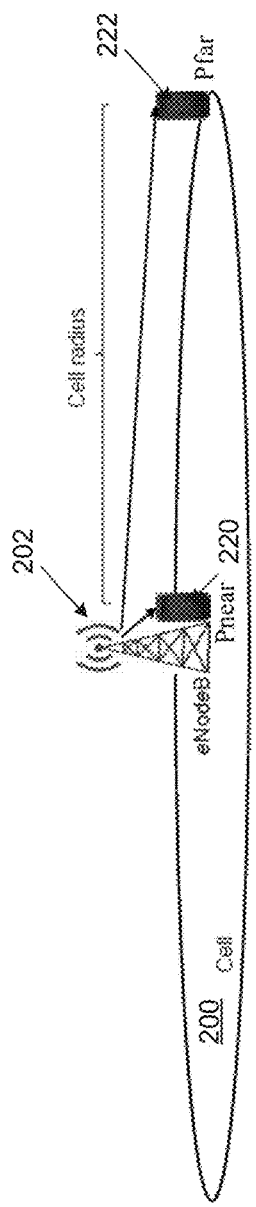
FIGS. 2A-2B are diagrams illustrating examples of differential delay within a terrestrial LTE cell and satellite communication beam.
Figure 2B:
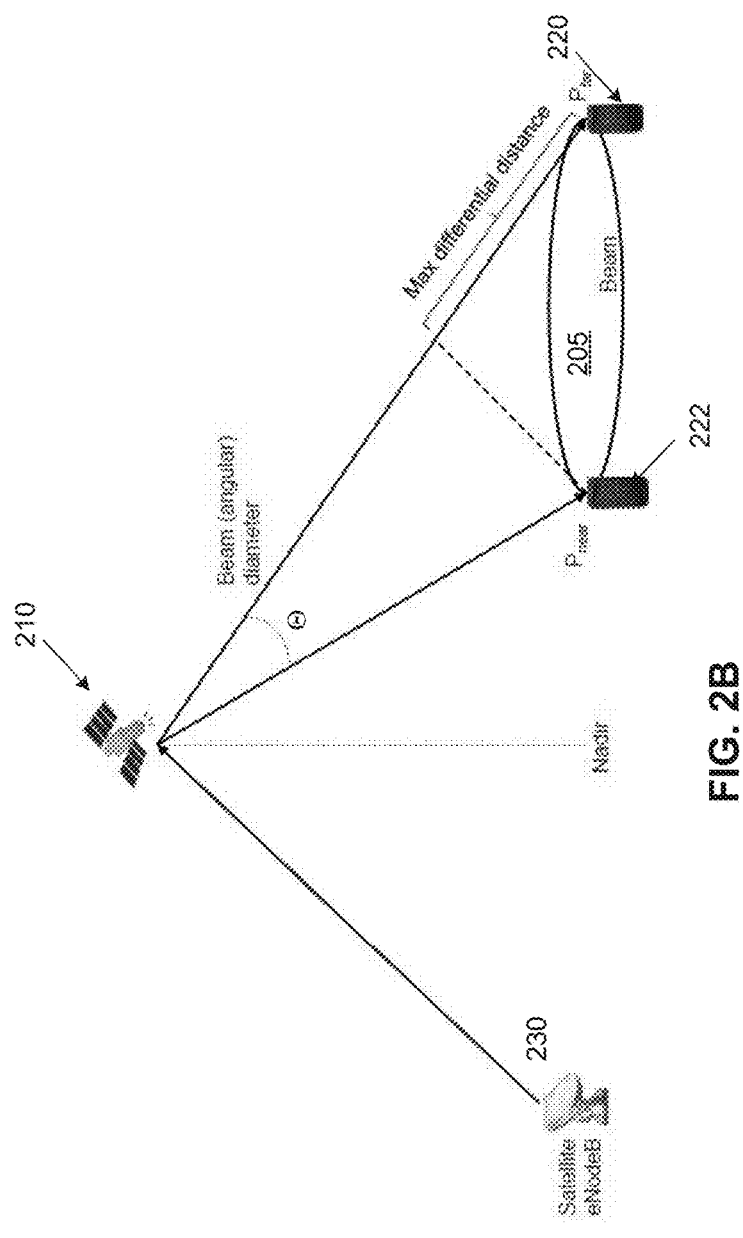

FIGS. 2A-2B are diagrams illustrating examples of differential delay within a terrestrial LTE cell and satellite communication beam. In terrestrial LTE, as shown in FIG. 2A, a terminal 220 (at Pnear) obtains the delay between itself and the eNB 202 through a process called acquisition. The acquisition mechanism specified in the 3GPP standard allows for a minimum delay of 0 and a maximum delay of about 0.33 msec. For this reason the maximum a cell radius for the eNB 202 tower centered in the cell 200 and supported by terrestrial LTE is about 100 km (0.33 msec*(speed of light) 300 km/msec). The highest differential delay between two terminals (e.g., 220 and 222 (at Pfar)) can be as large as 0.33 msec.

In a mobile satellite communications system, as shown in FIG. 2B, the differential delay between users (e.g., 222 and 220) in a beam (cell) 205 can be significantly larger. The highest differential delay within the beam 205 can be a function of the beam size, distance of beam center to the satellite nadir, and satellite altitude. The diagram shown in FIG. 2B is a simple representation without showing the effect of earth curvature. The diagram shows a geostationary (GEO) satellite 210 that communicates with a satellite antenna 230 and a number of terminals (e.g., 220 and 222). For the GEO satellite 210 that can maintain its orbit with near 0 degree inclination, and with an example beam size (θ) of about 1 degree angular diameter (e.g., measured at the satellite towards earth), the maximum differential delay can be shown to be about 2.84 msec within a beam centered at about 45 degree latitude and at the same longitude as that of the satellite. Even with a much smaller beam size of 0.2 degree diameter, a beam centered at 50 degree latitude and same satellite longitude leads to a maximum differential delay of 0.70 msec.

To conserve fuel for station keeping, a GEO communications satellite for mobile users is typically operated to allow the orbit to be inclined over the life of the satellite, for example, by as much as 7 degrees (in the North-South direction). With this orbit inclination, the maximum differential delay is about 3.92 msec within a beam of 1 degree diameter that is centered at 45 degrees latitude and at the same longitude as that of the satellite. Even with a diameter of 0.2 degrees, a beam centered at 50 degree latitude and same satellite longitude still has a maximum differential delay of 0.97 msec.

With larger beam size and/or beams placed further from satellite nadir, the maximum differential delay within a beam can be larger than the examples above. Given the larger differential delay, the terrestrial LTE acquisition mechanism may not be directly applicable, and adaptations are needed for an LTE over Satellite LTE system. The disclosure herein first focuses on adapting LTE acquisition method to satellite communication networks and then shows that the same methods are applicable to NB LTE over satellite communication networks. The disclosed methods, when applied to LTE over satellite, leverage the LTE return link (uplink) physical layer time-frequency resource grid structure summarized in FIG. 3A and the return link acquisition burst formats shown in FIG. 4A.

FIGS. 3A-3B are diagrams illustrating examples of an LTE uplink (UL) and an NB LTE UL frequency-time resource grid. The LTE radio resource grid (e.g., 310 and 320 of FIG. 3A) is a time-frequency representation of the usage of a carrier to carry both control and user data information. In the time dimension there are repetitive 10 msec frames with each frame consisting of ten subframes that are about 1 msec in duration. In the frequency dimension, a carrier consists of multiple resource blocks (RBs) of 180 kHz. The number of RBs in a carrier depends upon the bandwidth size of the LTE carrier. For instance, there are 6 RB in the 1.4 MHz carrier (e.g., 1.08 MHz usable bandwidth plus guard band which is customarily not shown in a Grid), and 15 RBs in a 3 MHz carrier (e.g., 2.5 MHz usable bandwidth plus guard band).

FIG. 3A illustrates the example UL (user to eNB) direction resource grids for the 1.4 MHz and the 3 MHz carriers. In the uplink Grid, a block 314 (or 324) of 6 RB by n msec (e.g., n=1, 2, or 3) may be configured to be used for acquisition. The acquisition block 314 (or 324) is said to carry the physical random access channel (PRACH). In FIG. 3A the acquisition block 314 of resource grid 310 includes one PRACH with n=1, in a 3 MHz carrier and the acquisition block 3324 of resource grid 320 includes one PRACH with n=1, in a 1.4 MHz carrier.

In the example NB LTE UL grid 330 shown in FIG. 3B, each frame is a 60 msec in duration with 6 msec subframes and the carrier bandwidth is 200 KHz. The acquisition block 332 includes a PRACH with n=2 (e.g., 2×6=12 msec).

FIGS. 4A through 4D are diagrams illustrating an example of an LTE acquisition preamble 400, an NB LTE acquisition preamble 420, and corresponding parameter tables 410 and 430. The LTE acquisition preamble 400 shown in FIG. 4A illustrates an LTE PRACH preamble and its corresponding PRACH slot. The preamble consists of a cyclic prefix (CP) and a Zadoff-Chu (Z-C) sequence. The CP is just a copy of the tail end portion of the Z-C sequence of CP duration. The Z-C sequence has several good properties facilitating its detection at an eNB (e.g., 130 of FIG. 1). A PRACH slot is the time duration in which a PRACH preamble is transmitted and no other transmission (within the same frequency bandwidth) is allowed. The duration is that of a PRACH preamble plus a guard time (GT) and can be n subframes (e.g., n=1, 2, or 3).

The Table 410 shows LTE PRACH parameters for four different formats for the frequency division duplex (FDD) operation mode. The four formats (0-3) offer different levels of robustness to signal deterioration and, relevant to the current disclosure, support different maximum terminal uplink timing (in msec) uncertainty (in max timing uncertainty column) at acquisition, or equivalently, the maximum cell radius in Km (in max cell radius (km) column). The maximum timing uncertainty is the lesser of CP duration and guard time duration. The Table 410 further shows the PRACH slot duration to be n=1, 2, or 3 subframes. It is noted that the relationship among CP duration, GT duration, and max cell radius is approximately:

$$\min(CP,GT)*\text{speed of light}=2*\text{max cell radius}$$

where * represents multiplication. There may be other considerations in designing the exact duration of CP and GT, such as fading channel time spread to be accommodated.

For the NB LTE, the UE PRACH preamble 420 as shown in FIG. 4C, includes a CP of 0.4 msec duration, a Z-C sequence of 3.2 msec duration, and a GT of 0.4 msec duration. As shown in Table 430 of FIG. 4D, the other NB LTE PRACH parameters include a preamble duration (CP duration+Z-C duration+GT duration) of 4 msec, a max timing uncertainty of 0.4 msec and a max cell radius of 60 Km. The LTE acquisition process will be described below with respect to FIG. 5A.

Figure 5A:
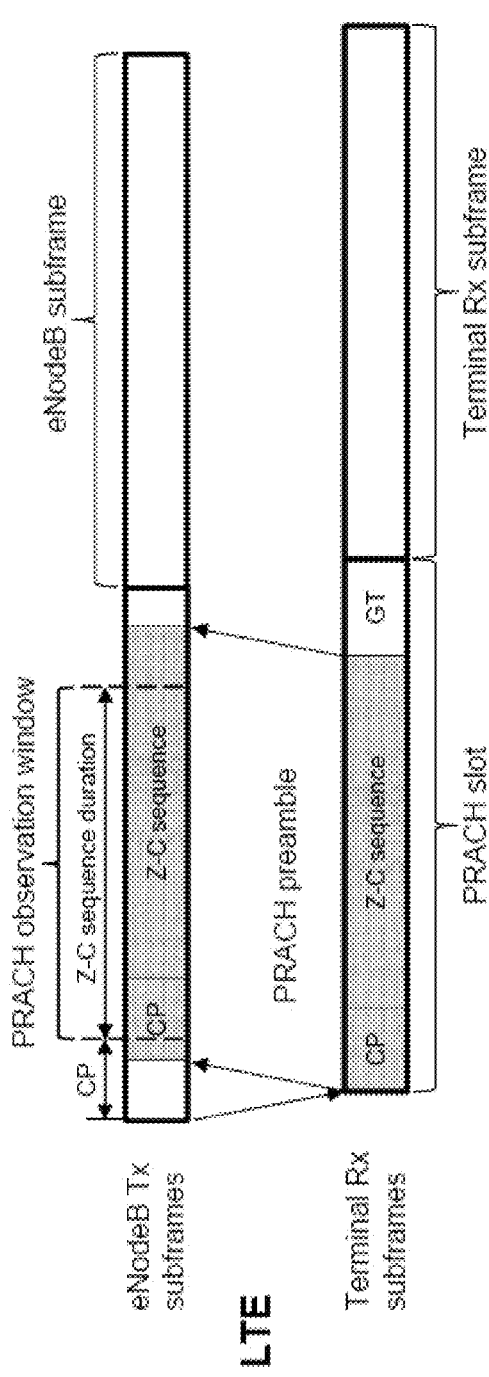
FIGS. 5A-5B are diagrams illustrating examples of physical random access channel (PRACH) reception windows associated with LTE and NB LTE protocols.
Figure 5B:
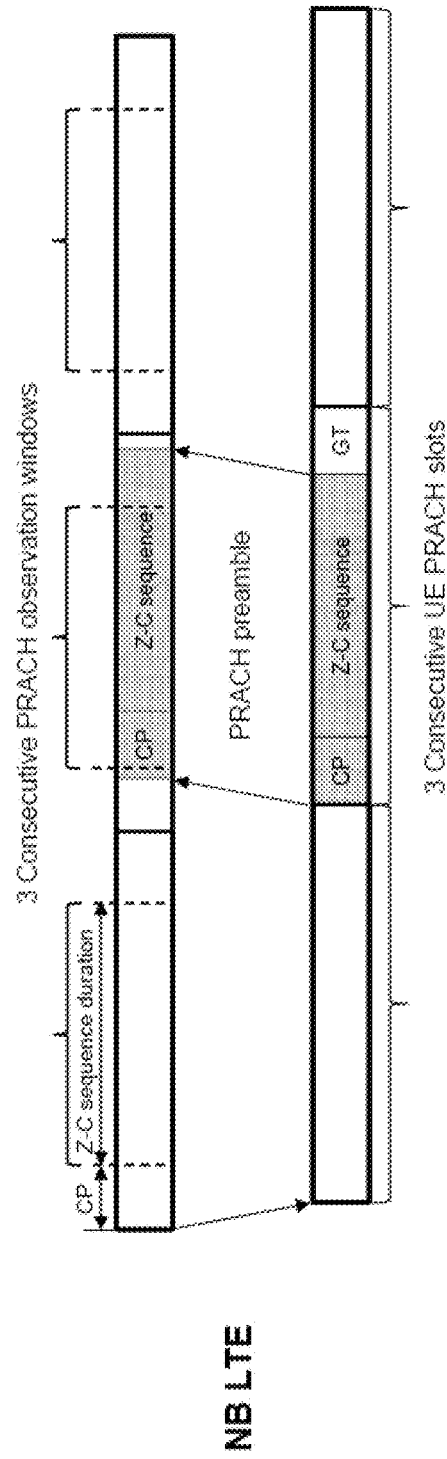

FIGS. 5A-5B are diagrams illustrating examples of PRACH reception windows associated with LTE and NB LTE protocols. The LTE acquisition process, as illustrated in FIG. 5A, is as follows. An eNodeB (eNB, e.g., eNB130 of FIG. 1) transmits a downlink carrier that embeds (frame and subframe boundary) timing information and contains PRACH (RB) frequency and (frame and subframe) schedule information. A terminal (e.g., 120 of FIG. 1) monitors and locks (e.g., synchronizes) on to the received downlink carrier frames and subframes and retrieves the PRACH frequency and schedule information. Due to the distance between the terminal and the eNB, the terminal receives frames and subframes later in time than (e.g. to the right of) those at the eNB by an offset equal to the delay between the terminal and the eNB. The terminal transmits a PRACH burst (in LTE terminology, a PRACH preamble) starting at the beginning of the receive (RX) subframe of a frame, in which PRACH is scheduled. The eNB receives the PRACH burst in the PRACH time slot starting at the scheduled subframe and frame and measures its arrival time against the eNB downlink subframe starting time. Due to the distance between the terminal and the eNB, the PRACH burst arrives at the eNB at a time that is twice the delay between the eNB and the terminal, after the start of the eNB subframe. The eNB sends a message addressed to the specific terminal with the measured two-times delay between the terminal and the eNB, called timing advance (TA) in LTE terminology.

The terminal can next apply the TA in its subsequent transmissions to the eNB, by shifting the start of a burst by TA amount of time earlier than the start of the intended subframe, so that the burst arrives at the eNB at start of the intended subframe. The eNB continues to measure terminal burst arrival time variation from eNB subframe boundaries and to continuously feedback the measured timing variation to the terminal, allowing the terminal to maintain its precise timing in transmission to the eNB.

An important aspect of the LTE acquisition process design is that the eNB only needs to detect a PRACH preamble in an observation window, as shown in FIG. 5A. The observation window starts at CP duration after the start of the subframe associated with the start of a PRACH slot, and the observation window extends for a duration of the Z-C sequence. If the terminal-eNB distance is within the maximum cell radius shown in Table 410, then it is guaranteed that the PRACH observation window will capture a full Z-C sequence, due to the cyclic nature of the CP, as shown in FIG. 5A. Some eNB implementations take advantage of this fact, to be able to run an efficient PRACH preamble detection and preamble arrival time estimation algorithm only within the observation window.

The diagram shown in FIG. 5B depicts a PRACH reception window associated with an NB LTE protocol, and shows three consecutive eNB PRACH observation windows and three consecutive terminal (e.g., UE) PRACH observation windows. The acquisition process for the NB LTE is similar to the LTE acquisition process discussed above and is skipped for the sake of brevity.

For acquisition in an LTE over satellite system, the acquisition mechanism has to accommodate a delay between the satellite eNB and a terminal located anywhere in a beam. The delay can be decomposed into two parts. First, the delay between the satellite eNB to the point $P_{near}$ in the beam that is closest to the satellite (e.g., the minimum delay of the beam). Second, the differential delay to satellite eNB between the location of the terminal and $P_{near}$. For a particular beam, its minimum delay is deterministic, being a function of satellite position in space, beam radius, and beam center location on earth. On the other hand, the differential delay is non-deterministic prior to the terminal acquiring into the system, and is dependent upon the terminal location within the beam. An important goal of the acquisition process is to determine this differential delay. The geometry of $P_{near}$ and maximum value of differential delay is shown in FIG. 2B. As an analogy, in terrestrial LTE illustrated in FIG. 2A, minimum delay is 0, and differential delay at a terminal is the delay between the eNB and the terminal.

Determination and use of per-beam lowest delay is ordinarily done in virtually all mobile satellite systems. This disclosure assumes that the calculation of the lowest delay is already accounted for and implemented and thus focuses only on the determination of differential delay of a terminal.

It may be straightforward to define a new PRACH burst for LTE over satellite, by increasing both the durations of the CP of the LTE PRACH preambles and the durations of the GT of the LTE PRACH slots, such that min (CP, GT) 2*max differential delay. This method may have some drawbacks. For example, the PRACH slot duration may be very long, for instance, more than four times the max differential delay. The longer the PRACH slot duration, the more spectral resources (frequency by time) needs to be dedicated to acquisition, and thus the less spectral resources for user communication. The PRACH slot duration may also exceed an LTE frame of 10 msec, leading to further complexities in spectral resource scheduling. For another example, existing terrestrial LTE implementation of PRACH preamble generation (at terminal) and PRACH preamble detection and estimation (at eNB) cannot be reused. Therefore, a substitute preamble structure may involve fundamental changes to the LTE PRACH design, leading to matters such as a CP being many times longer than the original Z-C sequence or a simultaneously longer Z-C sequence, which in turn further increases the duration of a PRACH slot. The disclosed solution provides two methods that avoid the above drawbacks and properly address the implementation of acquisition in an LTE over satellite system. The first method involves extending LTE PRACH and the second method involves using a GPS-assisted PRACH as described herein.

Figures 6A, 6B:
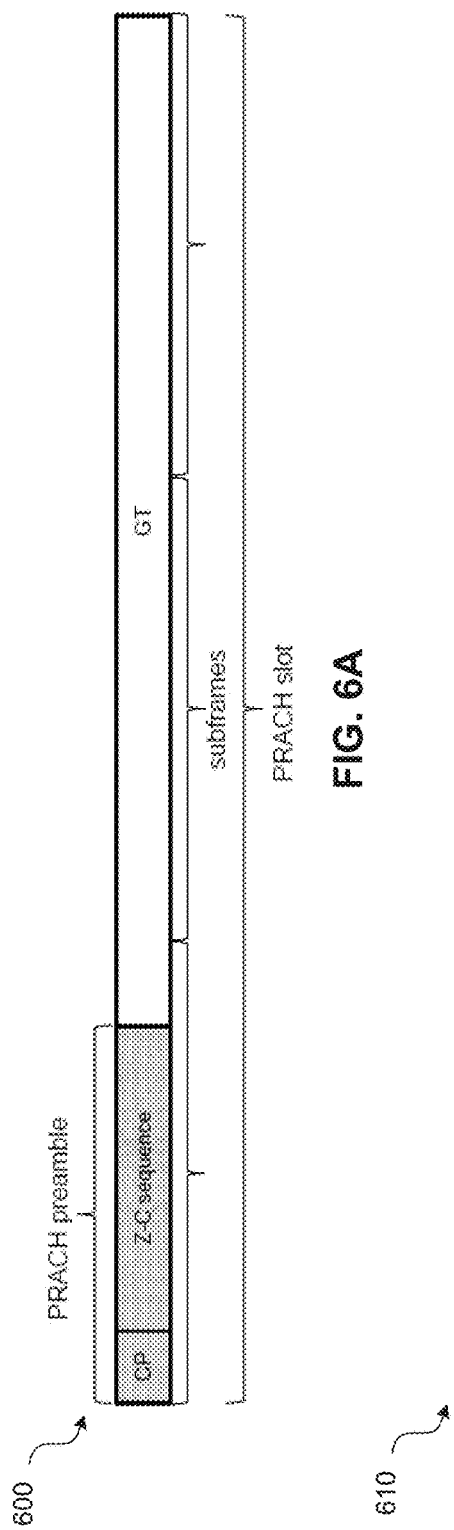
FIGS. 6A-6B are a diagram illustrating an example of an LTE over satellite acquisition preamble and a corresponding parameter table, according to certain aspects of the disclosure.

FIGS. 6A-6B are a diagram illustrating an example of an LTE over satellite acquisition preamble 600 and a corresponding parameter table 610, according to certain aspects of the disclosure. The first method of the subject disclosure involves extending the terrestrial LTE PRACH mechanism by extending the PRACH slots for the larger differential delay within satellite beams, and using a specific procedure for detecting PRACH preambles and estimating terminal timing advance (TA). In some aspects, the extension of the PRACH slots can be implemented by using the same terrestrial PRACH preambles (both CP and Z-C sequence), but with an expanded GT. The expanded GT is long enough to allow the PRACH slot duration to be sufficient to accommodate the maximum differential delay in a satellite beam (cell).

FIG. 6A illustrates the example of LTE format 0 preamble paired with a 2.097 msec guard time in a 3 msec (e.g., a 3-subframe) PRACH slot. Other examples corresponding to LTE formats 0-3 of Table 410 of FIG. 4B are shown in the Table 610, discussed below.

Table 610 of FIG. 6B shows, for each LTE preamble format (e.g., 0-3 of Table 410), four examples of different GT and PRACH slot duration values and the supported maximum differential delays. In the Table 610, each row is labeled with a format (first column) in the form of x-y, where x is the LTE preamble format, and y is the duration of the PRACH slot in msec. For example, for LTE preamble format 1, formats 1-3, 1-4, 1-5 and 1-10 are disclosed that share the same CP duration (e.g., 0.684) and Z-C sequence duration (e.g., 0.8), but different GT durations (e.g., 1.516, 2.516, 3.516 and 8.516) and consequently different slot durations (e.g., 3, 4, 5 and 10). The highest differential delay in the Table 610 is about 4 msec in some of the examples. Additional combinations of LTE preamble format and slot duration are possible to provide specific burst robustness (by the LTE preamble) and to accommodate specific maximum differential delay (by the expanded guard time).

Figure 7:
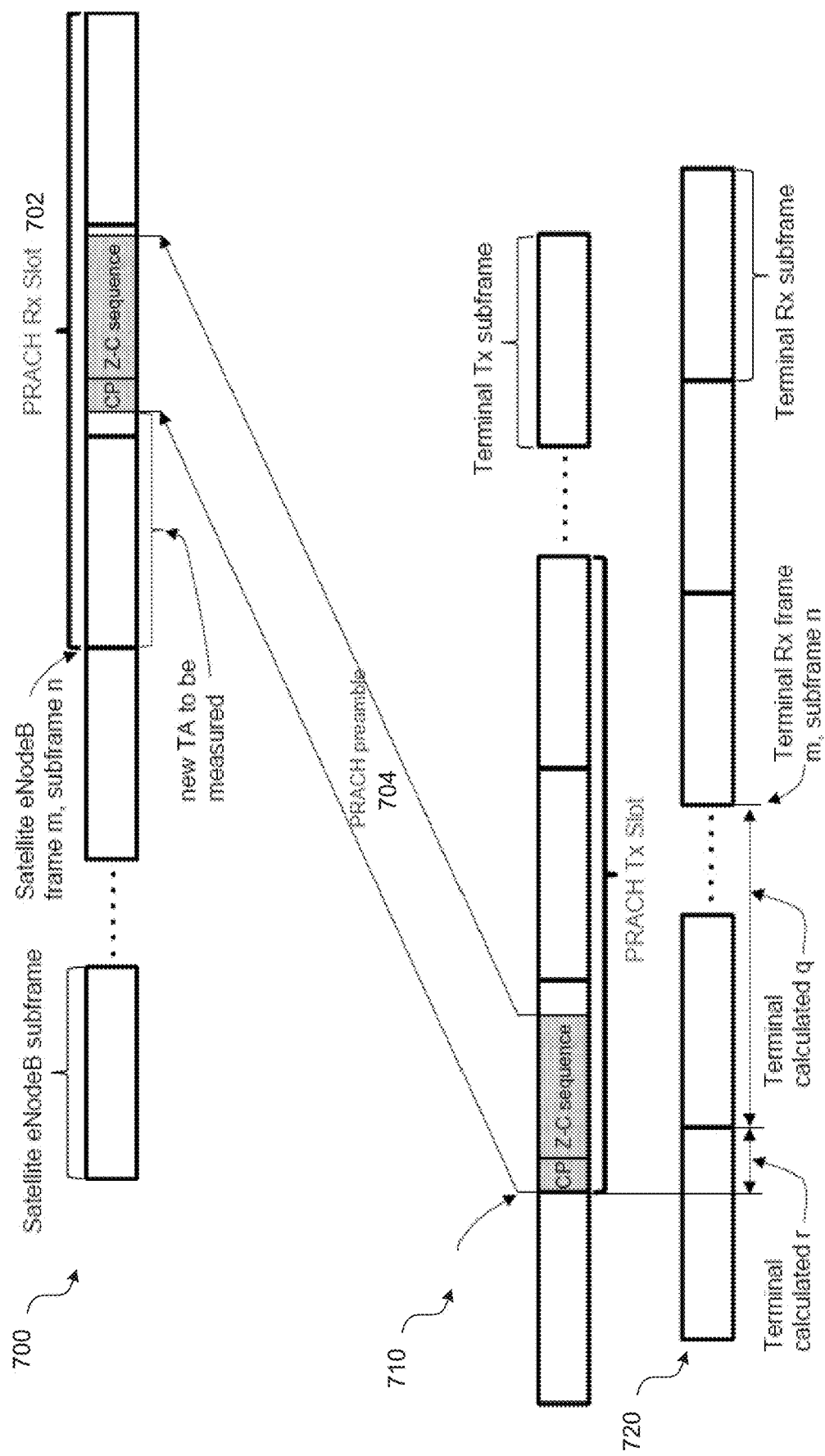
FIG. 7 is a diagram illustrating an example of an LTE over satellite PRACH timing, according to certain aspects of the disclosure.
Figure 8:
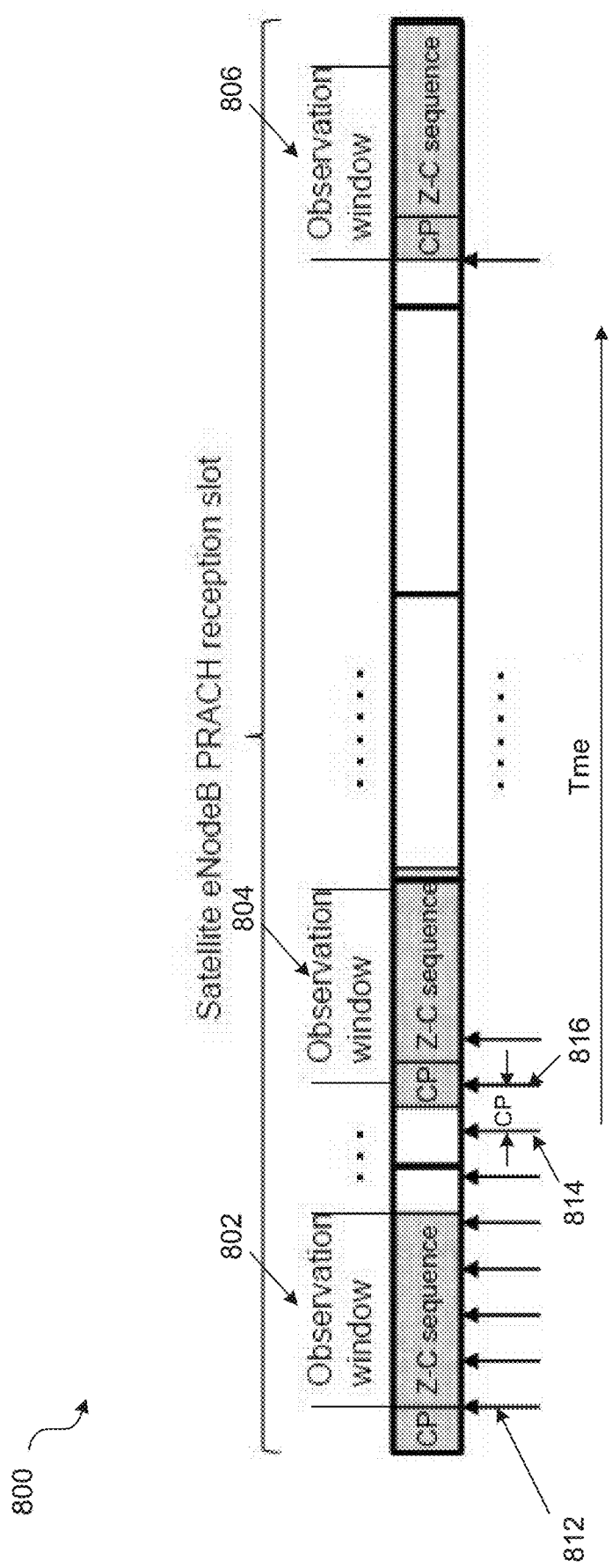
FIG. 8 is a diagram illustrating examples of an LTE over satellite PRACH receive (Rx) slot and observation windows, according to certain aspects of the disclosure.

In some aspects, the procedure for detecting PRACH preambles and estimating terminal timing advance (TA) includes three operations. In a first operation, the satellite eNB (e.g., 730 of FIG. 1), in the downlink carrier for each beam, includes the additional information of minimum delay for that beam. The minimum delay can be added to a Master Information Block (MIB). In a second operation, a terminal (e.g., 120 of FIG. 1) generates and transmits a standard PRACH preamble as in terrestrial LTE except for applying a self-calculated TA based upon the minimum delay received in the downlink carrier. The terminal already has the existing capability of applying a TA in the timing of the transmission towards the eNB after obtaining the delay information. This capability is now utilized on the timing of the PRACH preamble transmission as well. In a third operation, the satellite eNB detects the presence of PRACH preambles and estimates their respective time of arrivals in the expanded PRACH slot by applying the terrestrial LTE PRACH preamble detection and timing estimation algorithm successively in each of the observation windows. As indicated in FIG. 7 and FIG. 8, if a detection occurs in the $k^{th}$ observation window and delay measurement is made within the $k^{th}$ observation window as δ relative to the start time of the $k^{th}$ observation window, then the satellite eNB reports the new TA to be (k−1)*CP duration+δ. In terrestrial LTE, k is always 1.

FIG. 7 is a diagram illustrating an example of an LTE over satellite PRACH timing, according to certain aspects of the disclosure. As shown in an eNB transmit and receive frame and subframe structure 700 of FIG. 7, a frame m of a satellite eNB (e.g., the eNB 130 of FIG. 1) includes a subframe n that is the first subframe of a PRACH receive (Rx) slot 702.

As shown in a terminal transmit frame and subframe structure 710 of FIG. 7, a terminal (e.g., UE 120 of FIG. 1) applies a self-calculated TA to its PRACH preamble transmission timing. The terminal transmits the preamble early by the TA amount of time, relative to its receive frame and subframe structure 720, such that the preamble arrives at the satellite eNB within the intended PRACH Rx slot 702 beginning at subframe n of frame m. As shown in the eNB transmit and receive frame structure 700, the intended RACH Rx slot 702 at the satellite eNB is shown to begin at the start of subframe n of frame m. The terminal transmitted preamble 704, consisting of a CP and a Z-C sequence, arrives inside PRACH Rx slot 702.

Applying the TA by the terminal can be achieved by the terminal first calculating from TA two parameters, q and r (shown in a terminal Rx frame and subframe structure 720), and then transmitting the preamble q subframes plus r 1) msec before the start of the subframe n of the frame m of the terminal Rx (downlink) carrier. Equivalently, applying TA means that the terminal uses two framing structures. First, the structure of the frames and subframes of the received (downlink) carrier from the satellite eNB, and second, the structure of the frames and subframes of the Tx (uplink) carrier to be transmitted by the terminal. The uplink frame and subframe boundaries (e.g., of 710) are associated with time instances that are TA amount (=q subframes+r msec) earlier from the time instances associated with the boundaries of the same numbered frames and subframes in the received (downlink) carrier (e.g., of 720). It is understood that in terrestrial LTE, q is always 0.

It is noted that in subsequent transmissions to the satellite eNB after the PRACH preamble, a terminal should interpret the new TA received from the satellite eNB (estimated from the terminal PRACH preamble) as in addition to, rather than in replacement of, the first TA (calculated from beam minimum delay) that the terminal uses to transmit the PRACH preamble.

For terrestrial LTE, the TA measured from PRACH is represented at a resolution of about 0.52 μsec. To represent a maximum TA of about 0.66 msec (for a maximum cell radius of 100 km), 11 bits are specified for representing the TA. For LTE over satellite, TA resolution is the same as terrestrial LTE, but the maximum value of TA needs to be twice the maximum possible in-beam differential delay. Depending upon maximum beam size, 14 to 15 bits may be needed to represent the TA measured from the LTE over satellite PRACH.

FIG. 8 is a diagram illustrating examples of an LTE over satellite PRACH RX slot 800 and observation windows, according to certain aspects of the disclosure. The LTE over satellite PRACH RX slot 800 corresponds to a satellite eNB (e.g., 730 of FIG. 1) and includes multiple observation windows. Each observation window is identified by its starting time and all observation windows have the same duration which is the length of the Z-C sequence. The first observation window 802 has a start time 812 at one CP duration after the start of the PRACH slot, and the start times (e.g., 814 and 816) of two subsequent observation windows are all spaced in time with an interval equal to one CP duration. The last observation window is the one that starts at or after the time instance inside the PRACH slot, at which point a preamble still wholly fits inside the PRACH slot. The number of observation windows is:

$$\text{\# Observation Windows} = \left\lceil \frac{\text{PRACH Rx SlotDuration} - 1\,msec}{CP\,\text{duration}} + 1 \right\rceil$$

As two examples, for Format 0-3 (e.g., slot duration of 3 and CP of 0.103) in Table 610, the number of observation windows is 21, and for Format 1-4 (e.g., slot duration of 4 and CP of 0.684), 6 observation windows are in a PRACH Rx slot.

It is understood that the observation windows overlap. The placement of the observation windows is such that a PRACH preamble arriving anywhere inside the PRACH slot is fully captured by one observation window. A fully captured preamble fills the entire observation window and portions of the preamble may fall outside of either or both ends of the observation window. It is the instance of the LTE preamble detection and estimation algorithm executed in this observation window that will detect and estimate the timing offset of the preamble.

For a GEO satellite system, the lowest delay of a beam is within a range of about 240-260 msec. The dynamic range is about 20 msec. It is thus sufficient for the system to provide in MIB only the portion of the lowest delay above 240 msec and a terminal can add the value of 240 to the received value to arrive at the true minimum delay to use. To save the number of bits needed to represent the portion of minimum delay above 240 msec, a resolution of 0.1 msec can be used, such that the represented value is within 0.1 msec below the actual minimum delay. For example, if a true minimum delay is 257.76 msec, then the system can provide a value of 17.7 msec for the terminals to obtain 240+ 17.7=257.7 msec operational minimum delay. The PRACH slot duration needs to account for this 0.1 msec minimum delay representation resolution. The system can thereby provide the minimum delay information for a beam using 8 bits. The LTE downlink broadcast information, the MIB, currently has 9 spare bits. The minimum delay information described above thus fits in the MIB. There are other possible ways to provide the per-beam minimum delay information, such as using a new system information block (SIB). An added benefit of the 0.1 msec resolution representation of the minimum delay is that the represented minimum delay changes at most once during a normal 40 msec SIB broadcast cycle. In fact, for a GEO satellite with orbit inclined at 7 degrees, the represented minimum delay only needs to change no more frequent than once every 5.5 minutes, relaxing requirement on satellite eNB to calculate and transmit on time the minimum delay for each beam.

There are several advantages associated with the above disclosed acquisition method. For example, a terrestrial LTE terminal (e.g., UE) design on acquisition is retained, with the only changes being 1) to decode the per-beam minimum delay information from downlink broadcast and then 2) to calculate and apply the minimum delay-based TA to control the timing of PRACH preamble transmission and finally 3) to apply new TA values received from satellite eNB on top of the minimum delay-based TA. Also, a terrestrial LTE eNB design on acquisition is reused, with the changes being to broadcast the per-beam minimum delay information and to execute the terrestrial LTE PRACH preamble detection and estimation algorithm iteratively for each of multiple observation windows. Further, the PRACH slot duration is about twice that maximum differential delay, instead of four times the latter or longer as is the case with the straightforward method of increasing both the durations of the CP of the LTE PRACH preambles and the durations of the GT of the LTE PRACH slots as described above. Shorter PRACH slot can advantageously save spectral resources.

As explained above, the disclosed solution provides two methods that properly address the implementation of acquisition in an LTE over satellite system. The first method involving extending LTE PRACH was described above. The second method involves using a GPS-assisted PRACH and will be described herein.

Most new satellite communications terminals are equipped with a GPS receiver. A GPS receiver may act as a time source with accuracy better than 1 μsec. In an LTE over satellite system, a GPS-equipped terminal may measure its time delay from the satellite eNB and then determine the timing advance (TA) for transmitting a PRACH preamble to acquire into the system.

With accurate PRACH preamble transmission timing, accounting for satellite eNodeB to terminal delay, a PRACH preamble can arrive at the satellite eNodeB within a PRACH slot of the same duration that of the terrestrial LTE, shown in Table 410 of FIG. 4B. If in a particular beam, communication service is to be provided only to GPS-equipped terminals, then the PRACH slot duration can be set to one of those of the terrestrial LTE in Table 410, rather than those in Table 610 in FIG. 6B, resulting in a shorter PRACH slot that saves spectral resources.

It may be straightforward to include the communications satellite ephemeris and satellite eNB position information in a downlink carrier broadcast, for the terminals to use the information to calculate their respective delays to the satellite eNB. But doing so lowers the spectral resource efficiency and incurs additional processing at eNB.

Terrestrial LTE reference system time is represented by a system frame number (SFN). The SFN is a 10 bit counter that repeats every 1024×10 msec=10.24 seconds. The LTE MIB in the downlink carrier broadcast includes the upper 8 bits of SFN of the frame in which the MIB is transmitted from the eNB. The MIB is scrambled differently for each of the 4 frames sharing the same upper 8 bits of SFN. Thus, a terminal can determine the whole SFN by successfully decoding (including descrambling) the MIB in any one frame.

In some aspects, the second method of the subject disclosure includes procedures at both the satellite eNB and a respective terminal. In some implementations, at the satellite eNB, the start of the initial SFN cycle is aligned to a fixed epoch in GPS time known to the terminals. For example, GPS time 2020-Jan-01 00:00:00 may be defined as the epoch at which SFN=0. The satellite eNB thus ensures that its SFN count is aligned to GPS time with the particular offset. For instance, at 2020-Jan-01 12:00:15, which is 12 hours 15 seconds after the epoch, the SFN should be (12×3600+15)×100 modulo 1024=220.

At the respective terminal, the following four operations are performed. 1. The arrival GPS time $t_R$ of a downlink frame with SFN=K is measured. 2. The transmission GPS time $t_T$ of the frame from the eNB is derived from K and $t_R$. 3. A PRACH preamble TA is calculated as $2\times(t_R-t_T)$. 4. A PRACH preamble with timing adjusted by TA is transmitted towards the satellite eNB, as discussed above with respect to FIG. 7, when describing the first method.

In operation 2 above, it is recognized that a particular SFN value of K may correspond to a large number of GPS time instances spaced at 10.24 seconds. With $t_R$ and the fact that the satellite eNB to terminal delay is less than 0.3 seconds, the correct value of $t_T$ can be uniquely resolved. For example, for SFN=450, suppose an approximate GPS time $t_R$=2020-Jan-01 23:00:15.63697 is known to be within 0.3 seconds (<10.24/2=5.12 seconds) of the actual GPS time $t_T$ for the SFN, then since the two GPS time instances associated with SFN=450 that are closest to $t_R$ are 2020-Jan-01 23:00:15.380 and 2020-Jan-01 23:00:25.620, the unique GPS time $t_T$ is 2020-Jan-01 23:00:15.380. With this method, no additional information is generated at the satellite eNodeB and/or transmitted to the terminals.

The basic philosophy of NB LTE is to provide user data traffic transport in a manner similar to LTE but on a narrower bandwidth carrier with longer duration frames and subframes. For acquisition, an NB LTE PRACH burst, that is, an NB LTE preamble, still consists of a CP and a Z-C sequence, and a PRACH slot still includes a guard time (GT). All of CP, Z-C sequence, and GT of the NB LTE PRACH burst, as shown in FIG. 4C and Table 430 of FIG. 4D, are longer than their respective counterparts in LTE.

Both methods described above for LTE over Satellite apply to NB LTE over Satellite. For the first method, for example, the NB LTE PRACH preamble format is preserved, but the PRACH slot is expanded by increasing the GT duration to a value sufficient to accommodate the maximum in-beam differential delay of a beam. A terminal determines the TA for transmitting a PRACH preamble, based upon minimum delay received in the downlink MIB. And the satellite eNB executes the terrestrial NB LTE PRACH preamble detection and estimation algorithm iteratively in each of multiple observation windows.

The second method is independent of underlying PRACH preamble format and thus applies to NB LTE over Satellite. Due the longer frame duration, NB LTE SFN cycle duration is longer than the LTE 10.24 seconds, which, however, does not affect the operation of the second method.

The disclosed first and second methods leverage and reuse terrestrial LTE design and procedures for LTE over satellite communications. With these methods, PRACH preamble detection and estimation performance is the same as terrestrial LTE implementation. Further, the disclosed methods can also be applied to an LTE over satellite system operating in time division duplex (TDD) mode, to an LTE over airborne system operating either in FDD or TDD.

Figure 9:
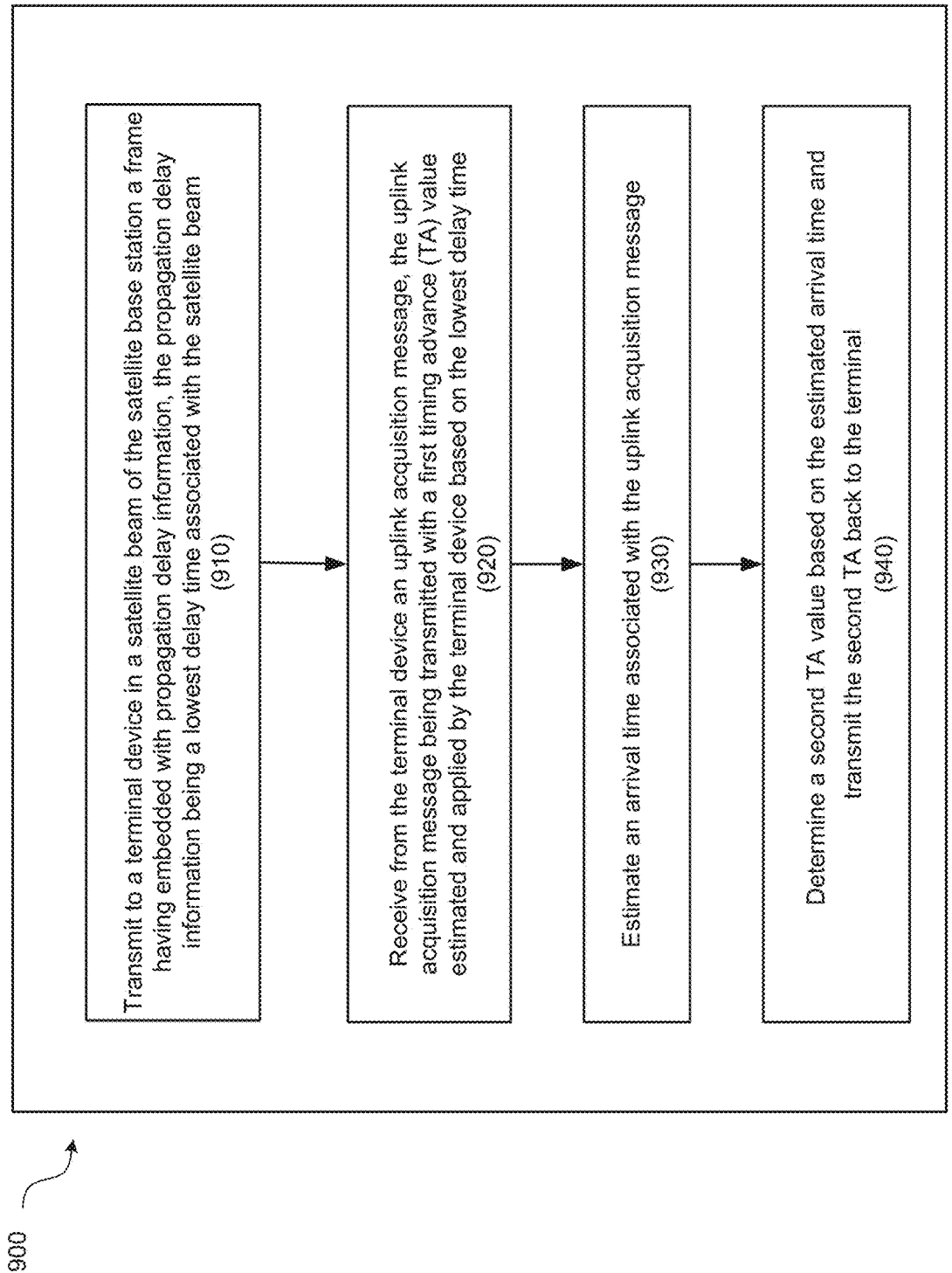
FIG. 9 is a flow diagram illustrating an example method of acquisition at a satellite eNB in a satellite LTE network, according to certain aspects of the disclosure.

FIG. 9 is a flow diagram illustrating an example first method 900 of acquisition in satellite LTE network at a satellite eNB, according to certain aspects of the disclosure. The method 900 includes transmitting to a terminal device (e.g., 120 of FIG. 1) in a satellite beam (e.g., 205 of FIG. 2B) of the satellite base station (e.g., 130 of FIG. 1) a frame embedded the lowest delay time associated with the satellite beam. An uplink acquisition message (PRACH) is received from the terminal device (920). The acquisition message (e.g., 710 of FIG. 7) is received with a first timing advance (TA) value estimated by the terminal device based on the lowest delay time (930). An arrival time associated with the acquisition message is estimated, and a second TA value is determined based on the estimated arrival time and is sent back to the terminal device (940).

Figure 10:
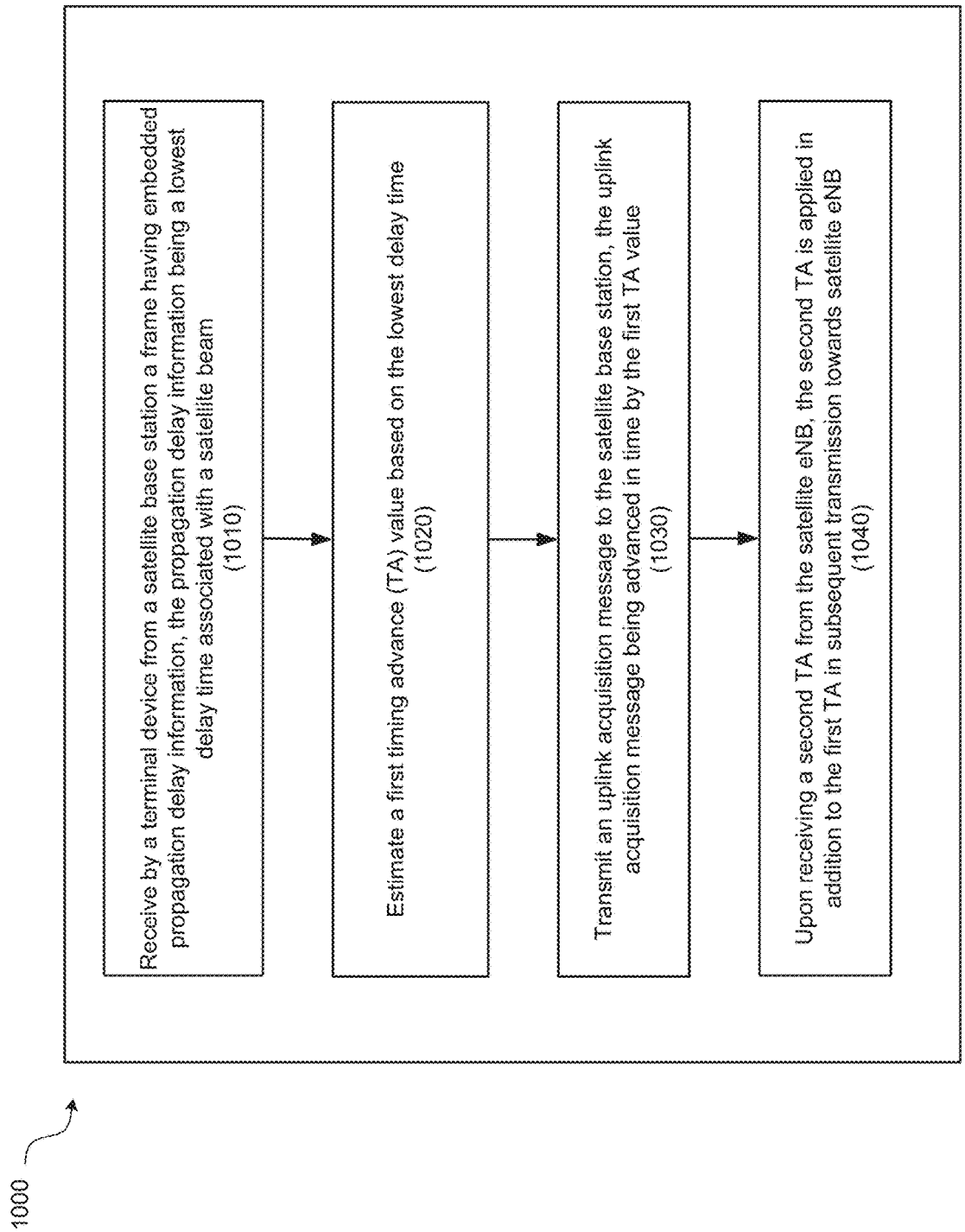
FIG. 10 is a flow diagram illustrating an example method of acquisition at a terminal in a satellite LTE network, according to certain aspects of the disclosure.

FIG. 10 is a flow diagram illustrating an example first method 1000 of acquisition in satellite LTE network at a terminal, according to certain aspects of the disclosure. The method 1000 includes receiving by a terminal device (e.g., 120 of FIG. 1) from a satellite base station (e.g., 130 of FIG. 1) a frame having embedded minimum propagation delay information (1010). The delay information is a lowest delay time associated with a satellite beam (e.g., 205 of FIG. 2B). A first timing advance (TA) value is estimated based on the lowest delay time (1020). An uplink acquisition message (e.g., 710 of FIG. 7) is transmitted to the satellite base station, and the uplink acquisition message is advanced in time by the first TA value (1030). In some embodiments, upon receiving a second TA from the satellite eNB, the second TA is applied in addition to, e.g., on top of, the first TA in subsequent transmission towards the satellite eNB (1040).

Figure 11:
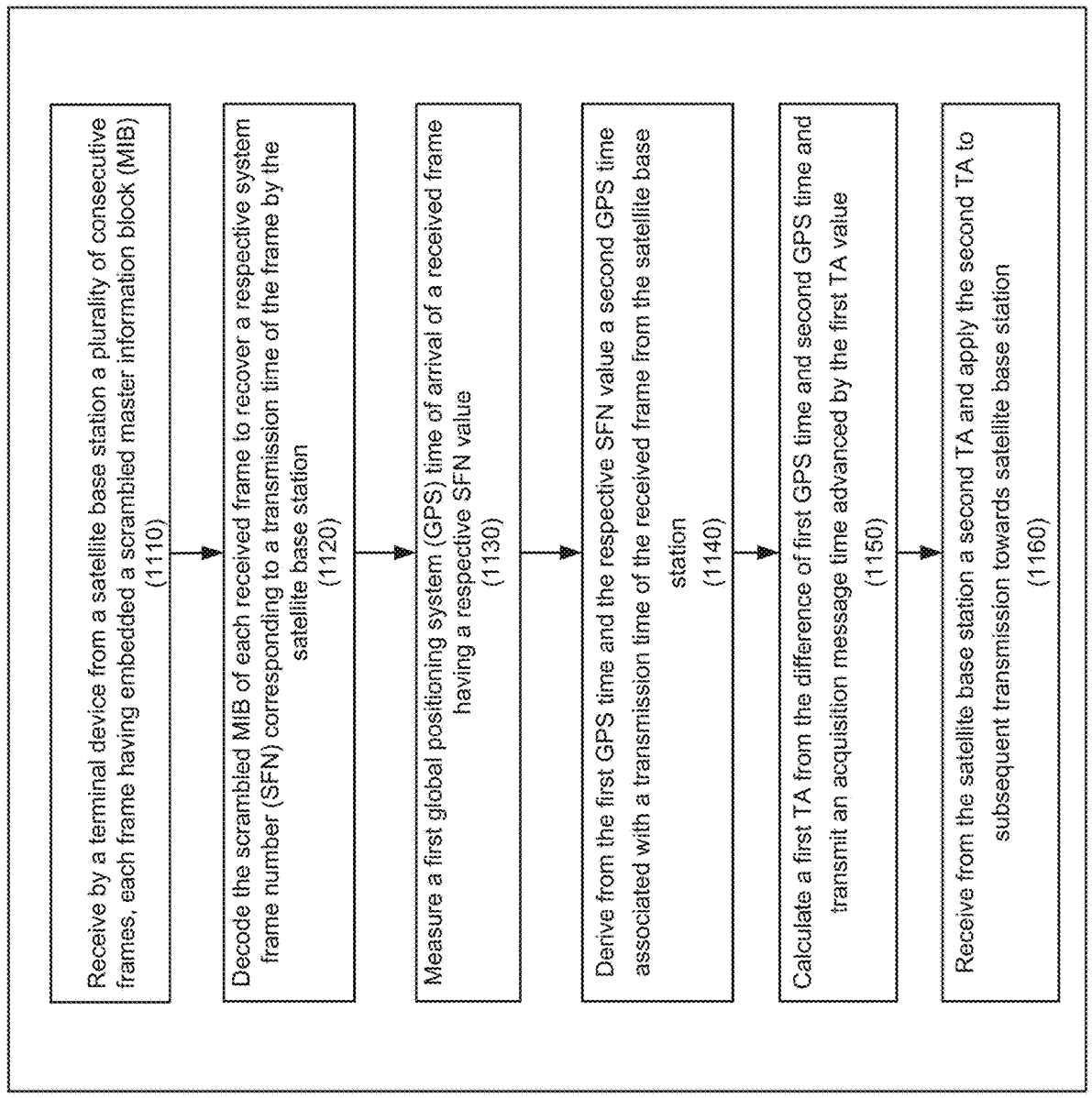
FIG. 11 is a flow diagram illustrating an example method of acquisition at terminal in a satellite LTE network, according to certain aspects of the disclosure.

FIG. 11 is a flow diagram illustrating an example second method 1100 of acquisition in satellite LTE network at terminal, according to certain aspects of the disclosure. The method 1100 includes receiving by a terminal device (e.g., 120 of FIG. 1) from a satellite base station (e.g., 130 of FIG. 1) a plurality of consecutive frames. Each frame has embedded information including a scrambled master information block (MIB) (1110). The scrambled MIB of each received frame is decoded to recover a respective system frame number (SFN), at which time the frame is transmitted by satellite base station (1120). A first global positioning system (GPS) time of arrival of a received frame embedding an SFN is measured (1130). A second GPS time associated with a transmission time of the received frame from the satellite base station is derived from the first GPS time and the SFN value embedded in the frame from the satellite base station (1140). The terminal calculates a timing advance (TA) as the difference between the first GPS time and the second GPS time (1150). The terminal receives from the satellite base station a second TA and applies the second TA to subsequent transmission towards satellite base station (1160).

Figure 12:
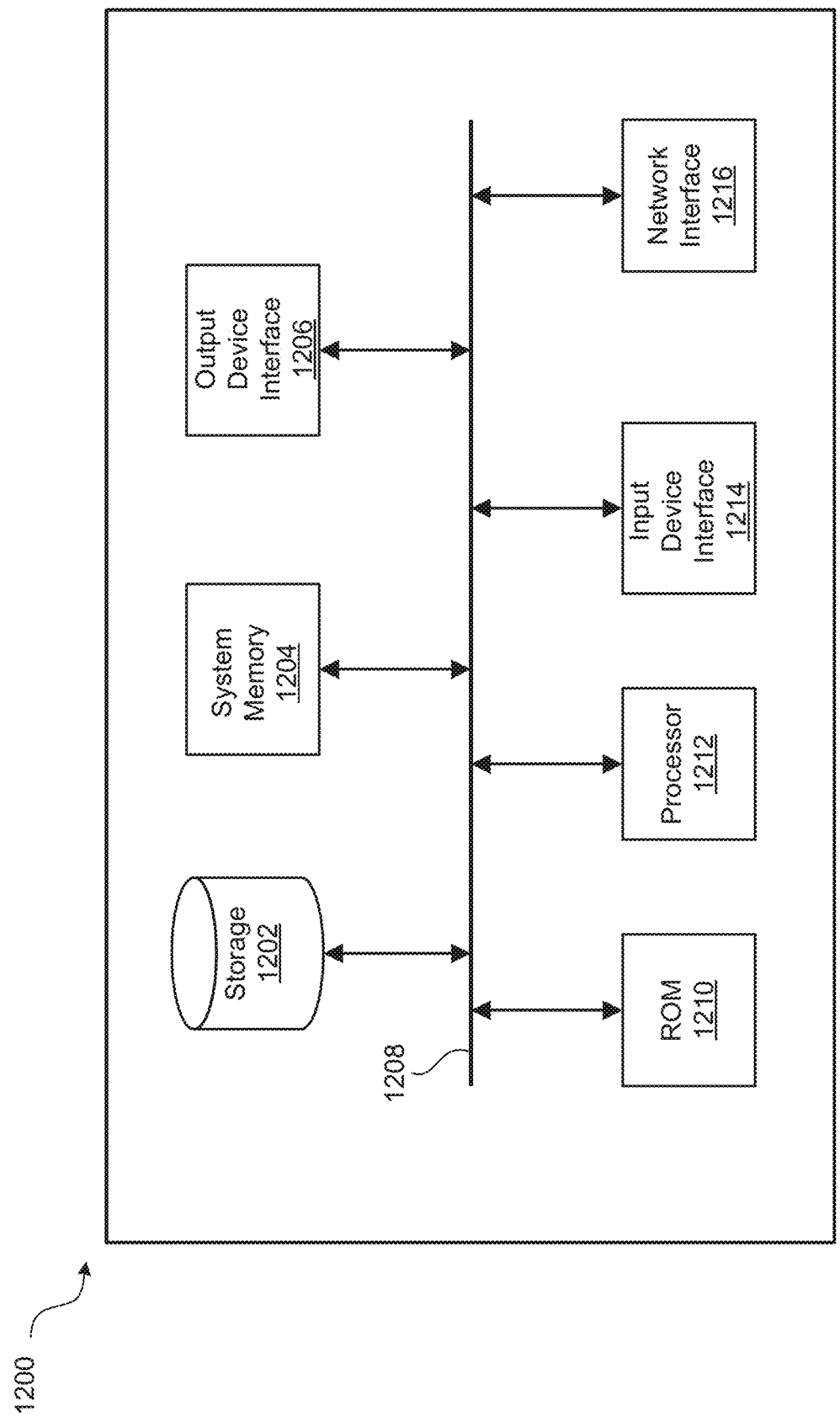
FIG. 12 is a block diagram conceptually illustrating an electronic system with which aspects of the subject technology are implemented.

FIG. 12 is a block diagram conceptually illustrating an electronic system 1200 with which aspects of the subject technology are implemented. Electronic system 1200, for example, can be a desktop computer, a laptop computer, a tablet computer, a server, a switch, a router, a base station, a receiver, a phone, a personal digital assistant (PDA), or generally any electronic device that has processing power and memory and communication capability. Such an electronic system may include various types of computer readable media and interfaces for various other types of computer readable media. Electronic system 1200 includes bus 1208, processing unit(s) 1212, system memory 1204, read-only memory (ROM) 1210, permanent storage device 1202, input device interface 1214, output device interface 1206, and network interface 1216, or subsets and variations thereof.

Bus 1208 collectively represents all system, peripheral, and chipset buses that communicatively connect the numerous internal devices of electronic system 1200. In one or more implementations, bus 1208 communicatively connects processing unit(s) 1212 with ROM 1210, system memory 1204, and permanent storage device 1202. From these various memory units, processing unit(s) 1212 retrieves instructions to execute and data to process in order to execute the processes of the subject disclosure. The processing unit(s) 1212 can be a single processor or a multi-core processor in different implementations. In some implementations, the processing unit(s) 1212 can be the communication processor of a base station such as a satellite eNodeB (eNB) and perform at least some of the functionalities discussed above with respect to the 900, 1000 and 1100 of FIGS. 9, 10, and 11, respectively.

ROM 1210 stores static data and instructions that are needed by processing unit(s) 1212 and other modules of the electronic system. Permanent storage device 1202, on the other hand, is a read-and-write memory device. This device is a non-volatile memory unit that stores instructions and data even when electronic system 1200 is off. One or more implementations of the subject disclosure use a mass-storage device (such as a magnetic or optical disk and its corresponding disk drive) as permanent storage device 1202.

Other implementations use a removable storage device (such as a floppy disk, flash drive, and its corresponding disk drive) as permanent storage device 1202. Like permanent storage device 1202, system memory 1204 is a read-and-write memory device. However, unlike storage device 1202, system memory 1204 is a volatile read-and-write memory, such as random access memory. System memory 1204 stores any of the instructions and data that processing unit(s) 1212 needs at runtime. In one or more implementations, the processes of the subject disclosure are stored in system memory 1204, permanent storage device 1202, and/or ROM 1210. From these various memory units, processing unit(s) 1212 retrieves instructions to execute and data to process in order to execute the processes of one or more implementations.

Bus 1208 also connects to input and output device interfaces 1214 and 1206. Input device interface 1214 enables a user to communicate information and select commands to the electronic system. Input devices used with input device interface 1214 include, for example, alphanumeric keyboards and pointing devices (also called "cursor control devices"). Output device interface 1206 enables, for example, the display of images generated by electronic system 1200. Output devices used with output device interface 1206 include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 12, bus 1208 also couples electronic system 1200 to a network (not shown) through network interface 1216. In this manner, the computer can be a part of a network of computers (such as a local area network ("LAN"), a wide area network ("WAN"), or an Intranet, or a network of networks, such as the Internet. Any or all components of electronic system 1200 can be used in conjunction with the subject disclosure.

Many of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. Examples of computer readable media include, but are not limited to, RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable and/or rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. A method for acquisition in a satellite long term evolution (LTE) network by a satellite base station, the method comprising:
   transmitting by the satellite base station to a terminal device in a satellite beam of the satellite base station a frame, the frame having embedded with propagation delay information, the propagation delay information being a lowest delay time associated with the satellite beam;
   receiving from the terminal device an uplink acquisition message, the uplink acquisition message being transmitted by the terminal device with a first timing advance (TA) value estimated by the terminal device based on the lowest delay time associated with the satellite beam;

estimating an arrival time associated with the uplink acquisition message;

determining a second TA value based on the estimated arrival time; and aligning satellite eNB transmission timing to a global positioning system (GPS) epoch and storing the GPS epoch in terminals.

2. The method of claim 1, further comprising transmitting to the terminal device a subsequent frame embedded with the determined second TA value.

3. The method of claim 1, wherein the frame includes a physical random access channel (PRACH) slot, and wherein the PRACH slot is an expanded LTE PRACH slot.

4. The method of claim 3, wherein the expanded LTE PRACH slot includes a cyclic prefix (CP), a zadoff-chu (Z-C) sequence and an expanded guard time (GT).

5. The method of claim 4, further comprising configuring a duration of the expanded GT to allow the expanded PRACH slot to accommodate a highest differential delay associated with the satellite beam.

6. The method of claim 4, wherein the expanded PRACH slot includes a plurality of observation windows, and wherein a duration of an observation window is equal to a duration of a Z-C sequence.

7. The method of claim 6, wherein start times of two subsequent observation windows of the plurality of observation windows are spaced in time with an interval equal to a duration of one CP.

8. The method of claim 1, wherein estimating the arrival time associated with the uplink acquisition message is performed by applying a terrestrial LTE PRACH preamble detection method and successively by applying a terrestrial LTE PRACH preamble arrival time estimation method.

9. The method of claim 1, further comprising transmitting a PRACH preamble with a corresponding timing adjusted by a determined PRACH preamble TA.

10. A method for acquisition in a satellite long term evolution (LTE) network, the method comprising:

receiving by a terminal device from a satellite base station a frame having embedded propagation delay information, the propagation delay information comprising a lowest delay time associated with a satellite beam;

estimating by the terminal device a first timing advance (TA) value based on the lowest delay time associated with the satellite beam;

transmitting by the terminal device an uplink acquisition message to the satellite base station, the uplink acquisition message being advanced in time by the first estimated first TA value; and receiving a subsequent frame from the satellite base station, the subsequent frame including a second TA value determined based on an estimated arrival time of an uplink response at the satellite base station.

11. The method of claim 10, wherein the terminal device is located in the satellite beam, and wherein estimating the first TA value is performed by using internal resources of the terminal device.

12. The method of claim 10, wherein the uplink acquisition message includes a physical random access channel (PRACH) preamble.

13. The method of claim 12, further comprising configuring a timing of the PRACH preamble to cause an arrival time of the PRACH preamble at the satellite base station to be within a PRACH receive (RX) slot.

14. The method of claim 10, further comprising transmitting a subsequent frame to the satellite base station, wherein the subsequent frame is advanced by a sum of the first TA value and the second TA value.

15. A method for acquisition over a satellite long term evolution (LTE) network, the method comprising:

receiving by a terminal device from a satellite base station a plurality of consecutive frames, each frame having embedded an scrambled master information block (MIB);

decoding the scrambled MIB of each received frame to recover a respective system frame number (SFN) corresponding to a transmission time of the frame by the satellite base station;

measuring a first global positioning system (GPS) time of arrival of a received frame having a respective SFN value; and deriving from the first GPS time and the respective SFN value a second GPS time associated with a transmission time of the received frame from the satellite base station.

16. The method of claim 15, wherein frame of the plurality of consecutive frames includes embedded propagation delay information identifying a lowest delay time associated with a satellite beam.

17. The method of claim 16, further comprising estimating by the terminal device a first timing advance (TA) value based on the lowest delay time associated with the satellite beam.

* * * * *